(12) United States Patent
Lopatin et al.

(10) Patent No.: US 6,495,443 B1
(45) Date of Patent: Dec. 17, 2002

(54) METHOD OF RE-WORKING COPPER DAMASCENE WAFERS

(75) Inventors: Sergey Lopatin, Santa Clara, CA (US); Richard J. Huang, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 50 days.

(21) Appl. No.: 09/874,513

(22) Filed: Jun. 5, 2001

(51) Int. Cl.[7] .................................. H01L 21/4763
(52) U.S. Cl. .................................. 438/618; 438/687
(58) Field of Search .................. 438/4, 618, 622, 438/629, 643, 678, 687

(56) References Cited

U.S. PATENT DOCUMENTS

| | | |
|---|---|---|
| 5,439,780 A | 8/1995 | Joshi et al. |
| 5,567,300 A | 10/1996 | Datta et al. |
| 5,705,230 A | 1/1998 | Matanabe et al. |
| 6,056,864 A | 5/2000 | Cheung |
| 6,056,869 A | 5/2000 | Uzoh |
| 6,066,030 A | 5/2000 | Uzoh |
| 6,103,086 A | 8/2000 | Woo et al. |
| 6,127,282 A | 10/2000 | Lopatin |
| 6,153,521 A | 11/2000 | Cheung et al. |
| 2002/0033341 A1 * | 3/2002 | Taylor et al. ............... 205/103 |
| 2002/0115283 A1 * | 8/2002 | Ho et al. .................... 438/633 |

OTHER PUBLICATIONS

Biolsi, P.; Ellinger, S.; Morvay,D.. Defect Reduction Methodology for Advanced Copper Dual Damascene Oxide Etch, Adv. Semiconductor Manufacturing Conference Workshop, 2000, pp. 312–322.*

* cited by examiner

*Primary Examiner*—Olik Chaudhuri
*Assistant Examiner*—Ginette Peralta
(74) *Attorney, Agent, or Firm*—Renner, Otto, Boisselle & Sklar, LLP

(57) ABSTRACT

A method of re-working a semiconductor device having a defective copper damascene interconnect structure, including the steps of obtaining a semiconductor wafer having at least one defect in a copper damascene interconnect structure; placing the wafer in an electrolyte in an electrolytic cell such that the defective copper damascene interconnect structure forms an anode; applying electrical current to the wafer to remove from the wafer substantially all copper from the defective copper damascene interconnect structure; re-applying copper to the semiconductor wafer to form a copper damascene interconnect structure.

20 Claims, 5 Drawing Sheets

METHOD OF RE-WORKING COPPER DAMASCENE WAFERS

FIELD OF THE INVENTION

The present invention relates to a method of re-working a defective copper damascene wafer for a semiconductor device. The invention has particular applicability in manufacturing high density semiconductor devices with deep submicron design features which include copper damascene interconnects, in which a defect occurs in the copper, to avoid scrapping the wafer including a defective copper damascene interconnect.

BACKGROUND ART

Current demands for high density and performance associated with ultra large scale integration (ULSI) require submicron features of significantly less than 0.25 microns, increased transistor and circuit speeds and improved reliability. As feature size decreases, the sizes of the resulting transistors as well as those of the interconnects between transistors also decrease. Fabrication of smaller transistors allows more transistors to be placed on a single monolithic substrate, thereby allowing relatively large circuit systems to be incorporated on a single, relatively small die area. This trend toward reduced feature sizes imposes severe demands on many aspects of IC fabrication, including interconnect formation. In the manufacture of integrated circuits, after the individual devices, such as the transistors, have been fabricated in the silicon substrate, they must be connected together to perform the desired circuit functions. The connections are commonly referred to as interconnects. Narrower interconnects have reduced cross-sectional area, which results in a higher interconnect resistance for a given interconnect material. This interconnect resistance, along with the capacitance of the interconnect with respect to ground and other interconnects, contributes to an RLC (resistive-inductive-capacitive) time constant which characterizes delays associated with propagation along the interconnect line. Fabrication of a circuit with increased RLC time constants lowers the speed at which the circuit can operate by increasing the time needed, for example, for a circuit output voltage to respond to a change in input voltage. Although there are other parasitic resistances and capacitances in an integrated circuit, such as those associated with the transistors themselves, in modem circuits having submicron feature sizes interconnects may contribute as much as 80% of the total circuit delay time. The increased interconnect resistance described above places a limit on how narrow interconnect lines can be and maintain tolerable interconnect resistance. The greater the resistivity of the interconnect material, the wider the lines must be, as discussed further below. As feature size decreases and transistor density increases, multiple layers of interconnect must be used to connect the transistors to each other and to the terminals of the integrated circuit. The limitation discussed above on the narrowness of interconnect lines can exacerbate this need for multiple interconnect layers. Fabrication of each interconnect layer requires deposition and patterning processes, adding to the expense of the circuit and increasing the opportunity for defect incorporation and the resulting yield reduction. It is therefore desirable to minimize the number of interconnect layers required.

Lowering the resistivity of the interconnect material alleviates the interconnect-related problems discussed above. Resistance, R, along the length of a structure formed from a given material is related to the resistivity, $\rho$, of the material by $R=\rho l/A$, where $l$ is the length of the structure and A is its cross-sectional area. It can therefore be seen that lowering the resistivity of an interconnect material reduces the resistance of an interconnect line of a given cross-sectional area. Furthermore, a line formed from a lower-resistivity material could be made narrower before an unacceptable resistance level is reached than a line formed from a higher-resistivity material. This ability to form narrower lines may allow fewer interconnect levels to be used to form the required connections for an IC, thereby reducing costs and potentially increasing the yield of correctly-functioning circuits.

Advantages such as those described above of low-resistivity interconnect materials have driven a movement in the semiconductor industry toward replacing aluminum interconnects with interconnects made from copper. The resistivity of pure copper (about 1.7 $\mu\Omega$·cm) is significantly lower than that of pure aluminum (about 2.6 $\mu\Omega$·cm). Both aluminum and copper interconnects typically contain small concentrations of other elements to improve interconnect reliability. These added elements increase the resistivity of the metal, but practical copper interconnects still have resistivities up to 40% lower than those of practical aluminum interconnects. Copper interconnects can therefore be made narrower than aluminum interconnects for a given value of interconnect resistance. This may result in fewer levels of metallization being needed with copper interconnects. For a given interconnect cross-sectional area, copper interconnects exhibit lower resistances, and therefore shorter interconnect-related delays, than do aluminum interconnects.

Because copper is more difficult to etch than aluminum, in addition to difficulties in etching narrow features in metals in general as compared to etching of insulators, copper interconnects are generally formed by a damascene process.

In one connection process, which is called a "dual damascene" technique, two channels of conductive materials, are positioned in vertically separated planes perpendicular to each other and interconnected by a vertical "via" at their closest point.

The first channel part of the dual damascene process starts with the placement of a first channel dielectric layer, which is typically an oxide layer, over the semiconductor devices. A first damascene step photoresist is then placed over the oxide layer and is photolithographically processed to form the pattern of the first channels. An anisotropic oxide etch is then used to etch out the channel oxide layer to form the first channel openings. The damascene step photoresist is stripped and an optional thin adhesion layer is deposited to coat the walls of the first channel opening to ensure good adhesion and electrical contact of subsequent layers to the underlying semiconductor devices. A barrier layer is then deposited on the adhesion layer to improve the formation of subsequently deposited conductive material and to act as a barrier material to prevent diffusion of such conductive material into the oxide layer and the semiconductor devices. A first conductive material is then deposited and subjected to a chemical-mechanical polishing process which removes the first conductive material above the first channel oxide layer and damascenes the first conductive material in the first channel openings to form the first channels.

The via formation step of the dual damascene process starts with the deposition of a thin stop nitride over the first channels and the first channel oxide layer. Subsequently, a separating oxide layer is deposited on the stop nitride. This is followed by deposition of a thin via nitride. Then a via step photoresist is used in a photolithographic process to designate round via areas over the first channels.

A nitride etch is then used to etch out the round via areas in the via nitride. The via step photoresist is then removed, or stripped. A second channel dielectric layer, which is typically an oxide layer, is then deposited over the via nitride and the exposed oxide in the via area of the via nitride. A second damascene step photoresist is placed over the second channel oxide layer and is photolithographically processed to form the pattern of the second channels. An anisotropic oxide etch is then used to etch the second channel oxide layer to form the second channel openings and, during the same etching process to etch the via areas down to the thin stop nitride layer above the first channels to form the via openings. The damascene photoresist is then removed, and a nitride etch process removes the nitride above the first channels in the via areas. An adhesion layer is then deposited to coat the via openings and the second channel openings. Next, a barrier layer is deposited on the adhesion layer. This is followed by a deposition of the second conductive material in the second channel openings and the via openings to form the second channel and the via. A second chemical mechanical polishing process leaves the two vertically separated, horizontally perpendicular channels connected by cylindrical vias.

The use of the dual damascene technique eliminates metal etch and dielectric gap fill steps typically used in the metallization process. The elimination of metal etch steps is important as the semiconductor industry moves from aluminum to other metallization materials, such as copper, which are very difficult to etch.

Electroplating is a preferred technique for copper interconnect formation in integrated circuits due to its high trench filling capability and relatively low cost. Electromigration failures in copper interconnect are dependent on surface conditions because the surface and interfacial diffusions of copper have a lower activation energy than grain boundary diffusion. For a damascene process with full copper encapsulation by barrier materials, electromigration can be reduced by restriction of diffusion pathways along the surface. In order to achieve such reduction, the copper electroplating process must provide a completely filled structure in which voids and entrapments of electrolyte are absent. Voids and surface seams in damascene copper lines and plugs also should be eliminated to maximize electrical conductivity of the lines. This can be achieved if the deposition rate along via and trench sidewalls is greater at the bottom and lower sidewalls while the trench-via top opening remains open. Such enhanced filling is achieved in electroplating solution by action of organic additives with chloride ions at the surface and by pulsed electrodeposition.

In manufacturing, variations in organic additive preparations, their mixtures with plating solution as well as variations in pulse deposition conditions are monitored and controlled. However, mistakes occasionally occur which lead to deleterious concentration changes or pulse condition changes, which cause the formation of voids, seams or clefts in the copper damascene interconnect or via structures. Additionally, voids can occur at via or trench sidewalls when the seed layer is discontinuous as a result of, e.g., poor step coverage during, e.g., plasma vapor deposition (PVD) of the seed layer.

Thus, for the foregoing and other reasons, it is possible that a number of wafers may be produced which include such defects in the copper damascene interconnect structures. Since the interconnects are added at or near the end of the wafer fabrication process, i.e., back-end-of-line (BEOL), such defects would be extremely costly if the only recourse was to scrap the wafers including such defects. Therefore, a need exists for a method of reworking defective copper damascene interconnects which will avoid scrapping wafers containing such defective interconnects.

SUMMARY OF THE INVENTION

The present invention relates to a method for re-working a defective copper damascene interconnect structure. Thus, the present invention solves the problem of providing a method of reworking a defective copper damascene interconnect which will avoid scrapping wafers containing such defective interconnect. In addition, the present invention relates to a method of re-working a defective copper damascene interconnect structure which allows for returning the wafer to the fabrication process with little delay and little expense, thereby avoiding losses resulting from scrapping or more extensively reworking such wafers.

Thus, the present invention relates to a method of re-working a semiconductor device having a defective copper damascene interconnect structure, including the steps of obtaining a semiconductor wafer having at least one defect in a copper damascene interconnect structure; placing the wafer in an electrolyte in an electrolytic cell such that the defective copper damascene interconnect structure forms an anode; applying electrical current to the wafer to remove from the wafer substantially all copper from the defective copper damascene interconnect structure; and re-applying copper to the semiconductor wafer to form a copper damascene interconnect structure.

Thus, the present invention solves the problem of providing a method of reworking a defective copper damascene interconnect which will avoid scrapping wafers containing such defective interconnect.

DETAILED DESCRIPTION

Figure 1:
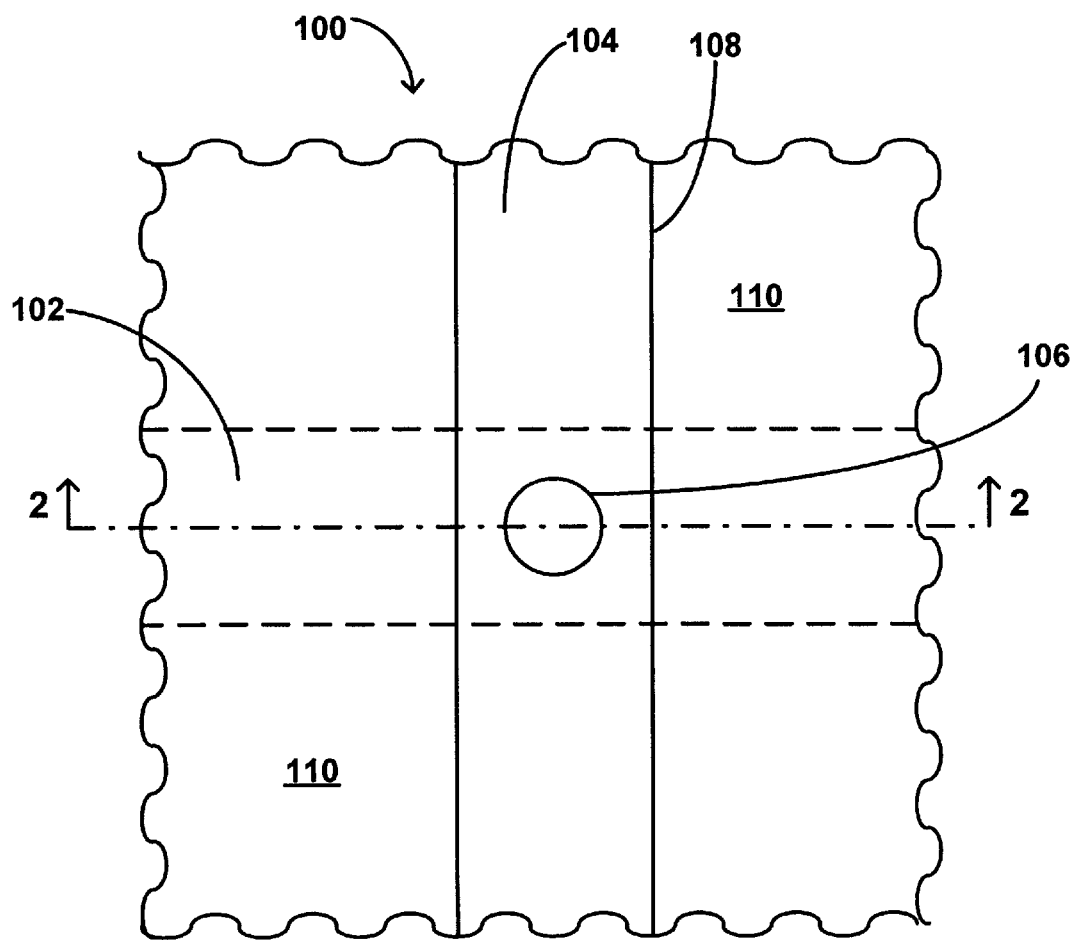
FIG. 1 is a plan view of an embodiment of a damascene interconnect.

Referring first to FIG. 1, therein is shown a plan view of a pair of aligned semiconductor damascene channels of a conductive material such as aluminum, tungsten, polysilicon or, in the present invention, copper, disposed over a production semiconductor wafer 100. A first damascene channel 102 is shown disposed below a second damascene channel 104 which extends substantially perpendicular to the first channel 102 in the plan view. Similarly, a round via 106 connects the first and second damascene channels 102 and 104 and is a part of the second damascene channel 104. In one embodiment, the via 106 is an integral part of the second damascene interconnect channel 104, the via 106 and the second channel 104 being formed as a single structure 104, 106, which may be referred to herein as damascene interconnect structures 104, 106. The first damascene channel 102 comprises a first conductive material. In one embodiment, the first conductive material is copper. The second damascene channel 104 is formed by filling a second channel opening 108 disposed in a second channel dielectric layer 110 with a second conductive material. In one embodiment, the second conductive material is copper.

Figure 2:
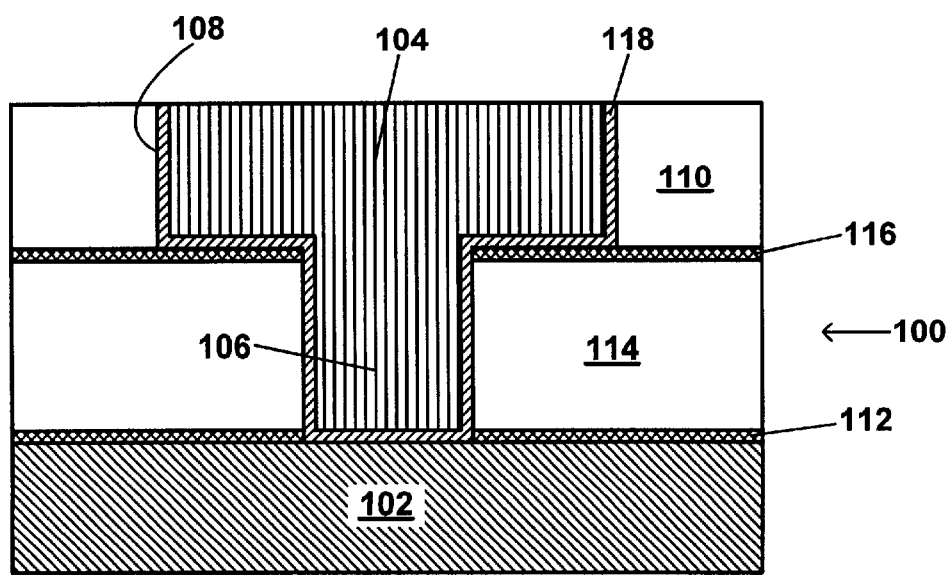
FIG. 2 is a partial cross-sectional view of an embodiment of a copper damascene interconnect, taken at line 2—2 of FIG. 1, which contains no defects.

Referring now to FIG. 2, therein is shown a cross-section, taken along a line 2—2 in FIG. 1, of a semiconductor device 100 which, as shown, does not include any defective sites in the damascene interconnect channel 104 or via 106. The first damascene channel 102 may be disposed over active circuit elements such as, e.g., a polysilicon gate and a dielectric of a semiconductor device on an integrated circuit chip (not shown). The first and second damascene channels 102 and 104 are in horizontal planes separated vertically by a stop nitride layer 112, a via dielectric layer 114, and a thin via nitride layer 116. One or more of these layers may be referred to as an interlevel dielectric (ILD). The cross-sectional area of the round via 106 of FIG. 1 forms a cylindrical via when it is filled with the second conductive material. The via 106 may have other cross-sectional shapes, such as square, rectangular, ovoid or elliptical.

The semiconductor device 100 of the embodiment of FIG. 2 includes a barrier layer 118 disposed around the second damascene channel 104 and the via 106, i.e., around the damascene interconnect structures 104, 106. The barrier layer 118 separates the second channel 104 and the via 106 from the second channel dielectric layer 110 and the via dielectric layer 114, respectively, i.e., from the remainder of the semiconductor wafer or the portions thereof adjacent the damascene channel 104 and the via 106. The barrier layer 118 provides insulation between the material of the second channel 104 and the via 106 and the second channel dielectric layer 110 and the via dielectric layer 114, respectively. The barrier layer 118 may act to prevent diffusion, migration or electromigration of metals such as copper from the conductive material in the channel 102 and the via 106 into the adjacent dielectric layers of the semiconductor wafer 100. The barrier layer 118 may also promote adhesion of the copper of the damascene interconnect structures 104, 106 to the material of the adjacent dielectric materials. The barrier layer 118 should be electrically conductive, so as to provide electrical connection between the second channel 104 and the underlying first channel 102.

The barrier layer 118 may be formed from one or more of Ta, TaN, TaSiN, TiSiN, TiW, or WN or similar materials known in the art. The barrier materials may also include cobalt (Co), nickel (Ni), palladium (Pd), molybdenum (Mo) and tungsten (W). The barrier may be formed of other alloys, for example, NiW, NiTa, NiMo, CoW, CoTa, CoMo, PdW, PdTa, and PdMo.

The barrier layer may be applied by various known metal deposition techniques. Such techniques include but are not limited to physical vapor deposition, chemical vapor deposition, electroless deposition, electroplating, ion-metal plasma (IMP), hollow cathode magnetron (HCM), sputtering, atomic layer deposition (ALD), or a combination thereof.

In one embodiment, the via dielectric layer 114 and the second channel dielectric layer 110 are formed of a conventional dielectric material, such as silicon dioxide, silicon nitride, or silicon oxynitride. In another embodiment, the via oxide layer 114 and the second channel dielectric layer 110 are formed of a low-K dielectric. A low-K dielectric is a dielectric material which exhibits a dielectric constant substantially less than conventional dielectric materials. Silicon dioxide is a conventional dielectric and has a dielectric constant of about 3.9–4.0. Air has a dielectric constant of 1. A low-K dielectric material has a dielectric constant in the range from about 1.1 to about 3.8. In one embodiment, the low-K dielectric material is an organic polymeric material, which has a K value in the range of about 2.0 to about 3.5. In one embodiment, the low-K dielectric material is a polymer of benzocyclobutene ("BCB") resin. BCB has a dielectric constant of about 2.7. In another embodiment, the low-K dielectric material is a deposition type and/or spin-on type material having a fluorine component. In one embodiment, the low-K dielectric is plasma polymerized hydrocarbylsilane, such as disclosed in U.S. Pat. No. 5,439,780, which the hydrocarbyl component may be alkyl, aryl and/or hydrogen. In another embodiment, the low-K dielectric material is a polymer of one of hydrogen silsesquioxane (HSQ), tetraethyl orthosilicate (TEOS), benzocyclobutene (BCB), parylene, polynapthalene or polyimide. Other organic low-K materials include polymers of hydrogen silsesquioxane, fluorinated polyimide, polyphenylquinoxaline, polyquinoline, and methysilsesquixane-polymer.

Figure 3:
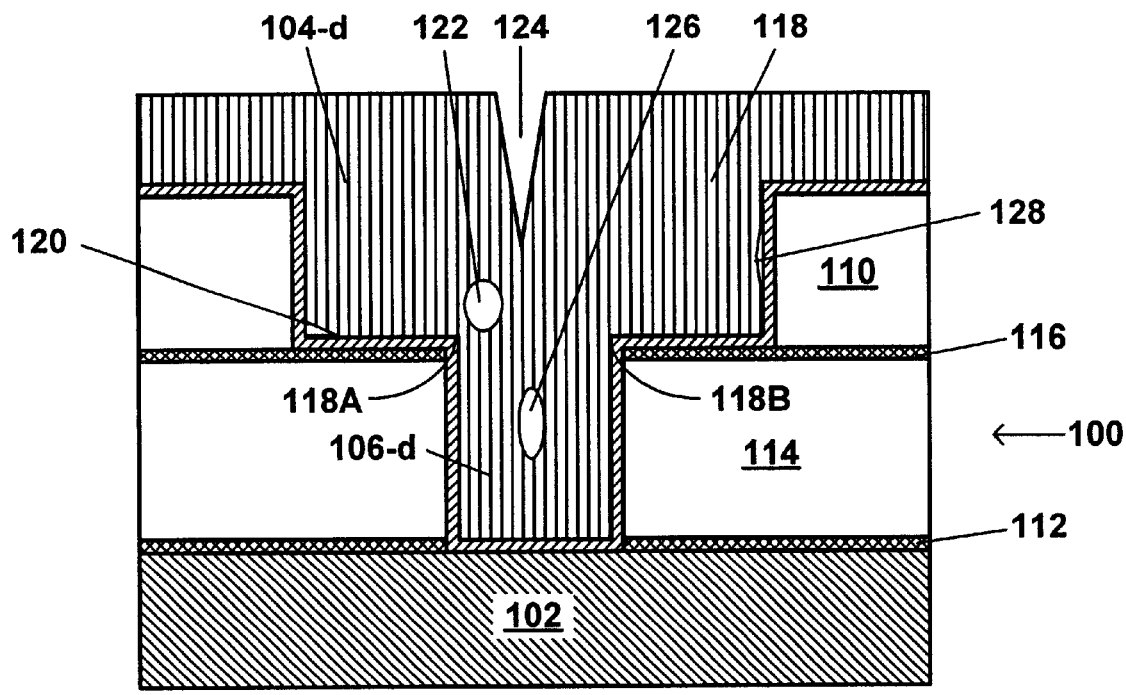
FIG. 3 is a partial cross-sectional view of a copper damascene interconnect, taken at line 2—2 of FIG. 1, during fabrication prior to planarization, which contains defects to which the method of the present invention may be applied.
Figure 4:
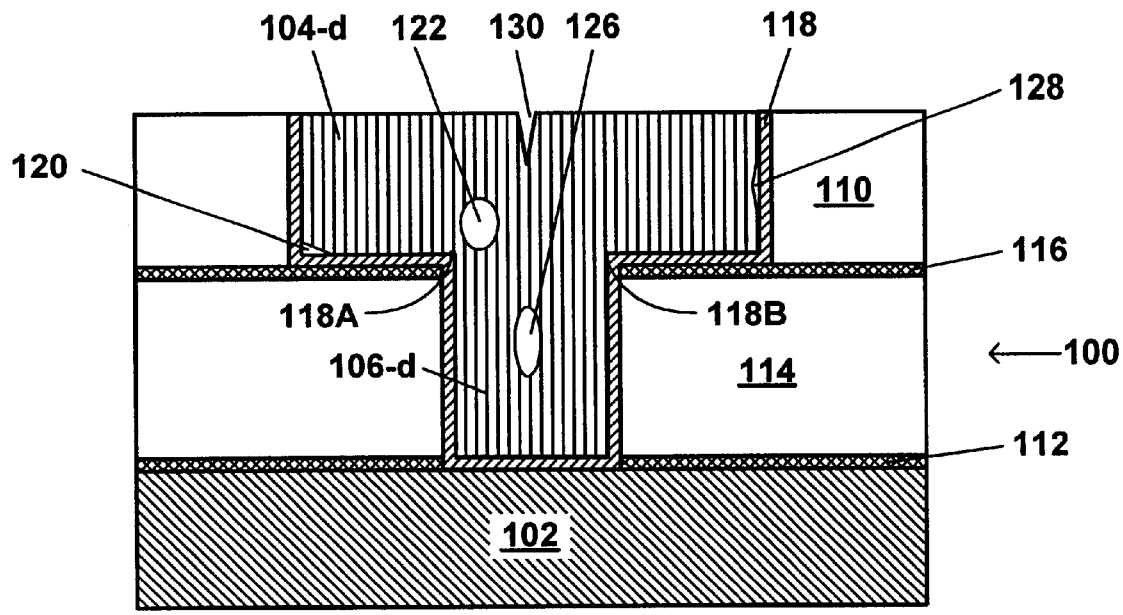
FIG. 4 is a partial cross-sectional view of a copper damascene interconnect, taken at line 2—2 of FIG. 1, during fabrication following planarization, which contains defects to which the method of the present invention may be applied.

With reference to FIGS. 3 and 4, which are cross-sectional views of a semiconductor wafer 100 taken at line 2—2 of FIG. 1, therein is shown defective copper damascene interconnect structures 104-d, 106-d, to which the method of the present invention may be applied. The portions of the wafer of FIGS. 3 and 4 which are the same as FIG. 2 include the same reference numbers, are described as above for FIG. 2, and are not described here. Since the defective structures 104-d and 106-d correspond to the non-defective structures 104 and 106, the same reference number is used, with the "-d" added to indicate that these are defective structures. The defective damascene interconnect structures 104-d, 106-d of FIGS. 3 and 4 are substantially similar to FIG. 2 in the primary structure, except for the defects in the copper damascene interconnect structures 104-d, 106-d, i.e., the second channel 104-d and the via 106-d. The wafer of FIG. 4 is shown after the surface shown in FIG. 3 has been planarized and excess copper deposited during formation of the copper damascene interconnect has been removed. As described below, the method of the present invention may be applied just after deposition of the copper, prior to planarization and removal of excess copper, i.e., when the semiconductor wafer 100 appears as exemplified by FIG. 3, or after planarization when the semiconductor wafer 100 appears as exemplified in FIG. 4.

As shown in FIG. 3, the copper damascene interconnect structures 104-d, 106-d include several defective structures. It should be understood that while the exemplary defective copper damascene interconnect structures 104-d, 106-d shown in FIGS. 3 and 4 include the defects described below, such defective copper damascene interconnect structures 104-d, 106-d may include one or more of these defects, or may include other defects not specifically described herein. Any defect which is present and renders the copper damascene interconnect structures 104-d, 106-d defective is included within the scope of the present invention.

As exemplary defects, FIG. 3 shows a corner void 120, a body void 122, a gap-fill cleft 124, a seam void 126 and a sidewall void 128. The corner void 120 and the sidewall void 128 may arise, for example, from too-rapid deposition of the copper. The body void 122 may arise, for example, either from too-rapid deposition of copper, or from poor step coverage when the copper is deposited by, e.g., PVD, or by allowing the concentration of one or more additives fall to a concentration too low, or by over-adding one or more additives, resulting in an incorrect concentration of one or more additives. The gap-fill cleft 124 may arise, for example, from incomplete gap filling, i.e., from discontinuing the electrodeposition of copper too soon, or from allowing the bath chemistry of the electrolyte to deviate too far from the optimal, so that the deposition of copper becomes erratic and uneven. The seam void 126 may arise, for example, as a result of excessive deposition at corners 118A and 118B of the barrier layer 118, relative to deposition on the adjacent sidewalls of the via 106, which can result in bridging-over, or closing, of the gap between the corners 118A and 118B before the via 106 has been completely formed. As noted above, the foregoing examples are merely exemplary, and are not intended to be limiting to the scope of the invention. The presence of any of these or other defects may render defective the copper damascene interconnect structures 104, 106 of the semiconductor wafer 100, thus necessitating use of the method of the present invention, or otherwise possibly scrapping the entire semiconductor wafer 100.

FIG. 4 is a cross-sectional view of a semiconductor wafer 100 similar to that shown in FIG. 3, except that in FIG. 4 the semiconductor wafer 100 has already been subjected to planarization when the defects are discovered. As will be understood, when the copper is electrodeposited, while it is generally deposited layer by layer, thus substantially maintaining the profile of the underlying target surface, when a gap such as the cavity formed by the channel 108 and the via 106 is to be filled, a gap-fill cleft 124 will form, and may remain at the end of the electrodeposition process. If the gap-fill cleft 124 has not closed and filled to a degree sufficient that the bottom of a surface cleft 130 will remain in the final surface of the semiconductor wafer 100 after planarization and removal of excess copper. The surface cleft 130, as described above, constitutes a defect in the copper damascene interconnect structures 104-d 106-d.

Methods

In one embodiment, the present invention relates to a method of re-working a semiconductor device having a defective copper damascene interconnect structure, including the steps of obtaining a semiconductor wafer having at least one defect in a copper damascene interconnect structure; placing the wafer in an electrolyte in an electrolytic cell such that the defective copper damascene interconnect structure forms an anode; applying electrical current to the wafer to remove from the wafer substantially all copper from the defective copper damascene interconnect structure; re-applying copper to the semiconductor wafer to form a copper damascene interconnect structure. Pertinent details of the method of reworking a defective copper damascene interconnect structure such as that shown in FIGS. 3 and 4 are set forth in the following, with reference to FIGS. 3–9. FIG. 9 is a process flow diagram of the steps of the method of this embodiment as set forth in the following.

In the first step of the method of the present invention, shown as Step S901 in FIG. 9, a semiconductor wafer 100 having a defective copper damascene interconnect structure is obtained. The defective structure may be identified as a result of standard quality control procedures. As is well known in the art, quality control procedures are applied to semiconductor wafers throughout the fabrication process. Thus, a defective wafer may be discovered at a stage as early as that shown in FIG. 3, e.g., immediately after deposition of the copper damascene interconnect structures 104-d, 106-d, or at a later stage, such as that shown in FIG. 4, e.g., after planarization and removal of excess copper.

Figure 5A:
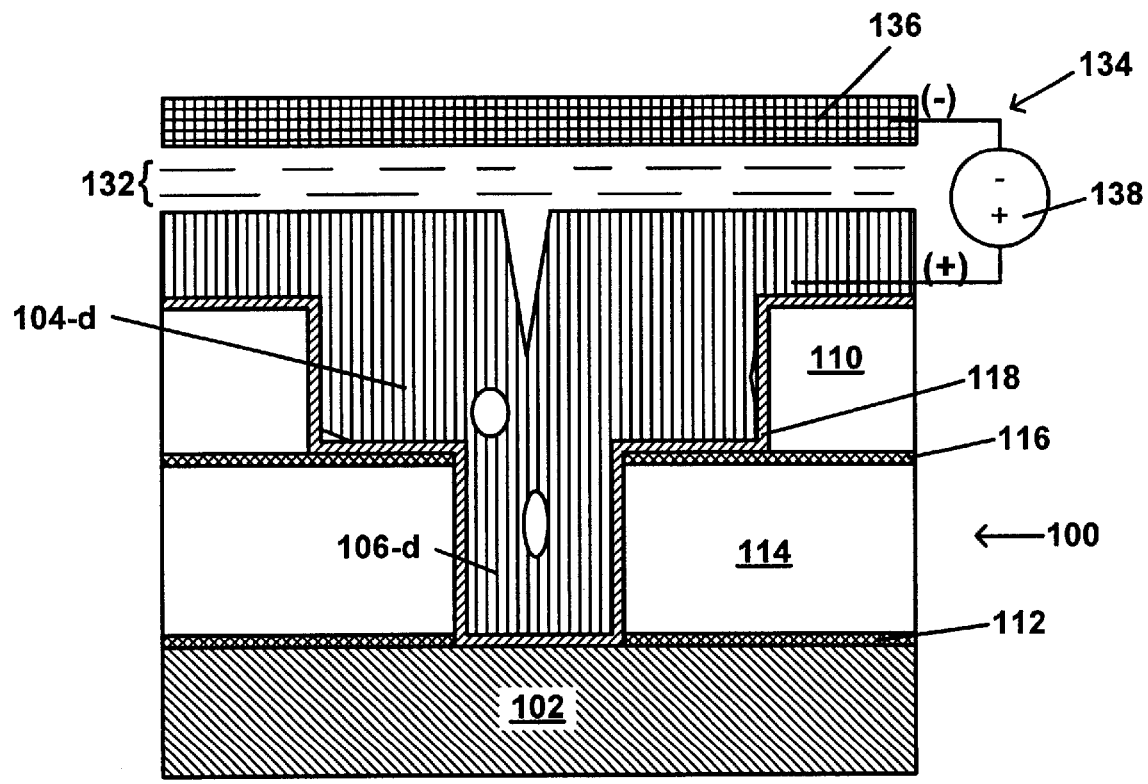
FIGS. 5(a) and 5(b) are partial cross-sectional views of wafer including defects in a copper damascene interconnect mounted in an apparatus for removing the defective copper layer, in accordance with the present invention.

In the second step of the method of the present invention, as shown in FIG. 5(a) and as Step S902 in FIG. 9, the semiconductor wafer 100 containing the defective copper damascene interconnect structures 104-d, 106-d is placed in an electrolyte 132 in an electrolytic cell 134 such that the defective copper damascene interconnect structure forms an anode when electrical current is applied. As shown in FIG. 5(a), the electrolytic cell 134 includes a cathode 136, is connected to a source of electrical current 138, and contains the electrolyte 132. As noted above, the defective semiconductor wafer 100 constitutes or forms the anode. The cathode may be copper, or another metal such as, e.g., titanium or platinum. The source of electrical current 138 may be any appropriate device known in the art, such as a battery, a d.c. rectifier, etc. A pulsed power source is preferred for electropolishing. Methods of pulsed source electropolishing are known in the art, and any such method may be used. Following this Step S902, in this embodiment, the process moves next to step S904, as shown by the arrow in FIG. 9 which bypasses Step S903, which is an optional step.

Figure 5B:
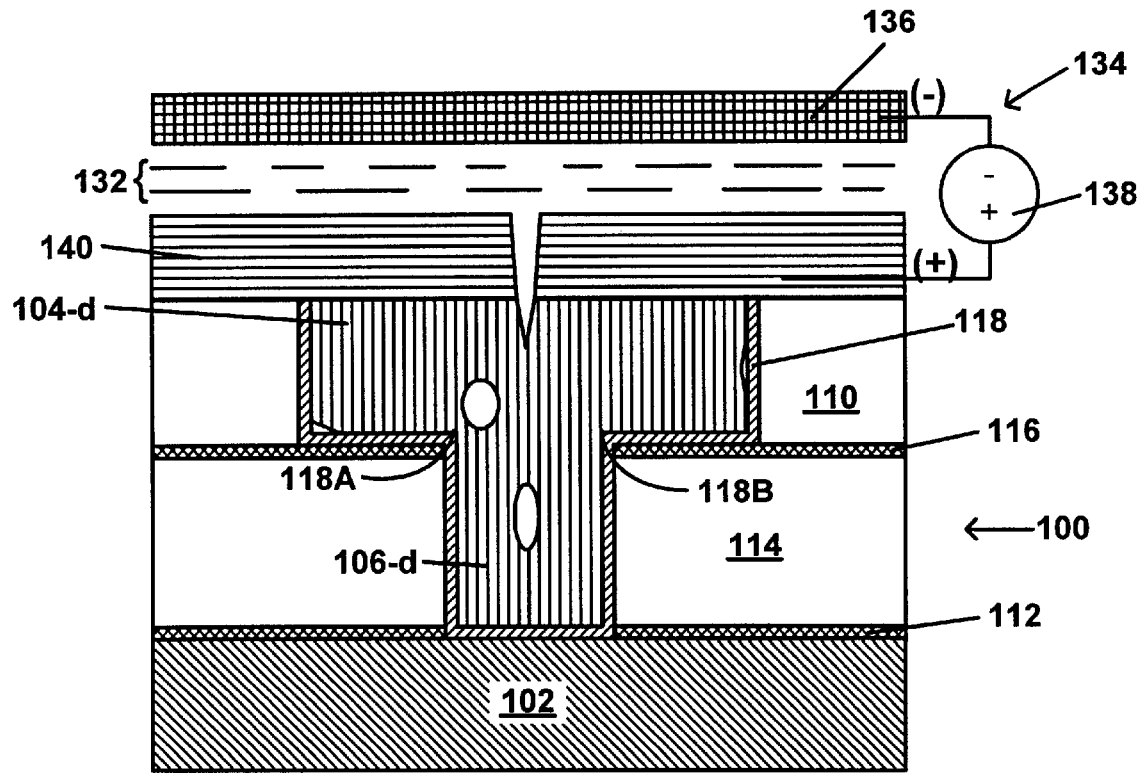

In an alternative embodiment, shown in FIG. 5(b), and in Step S903 of FIG. 9, when the defects in the defective copper damascene interconnect structures 104-d 106-d are not discovered until after planarization, an additional step is added. In this embodiment, since the copper which had originally covered the surface of the wafer 100 has been removed by planarization, an electrical connection to all of the defective copper damascene interconnect structures 104-d, 106-d on the wafer needs to be reestablished. To establish this connection, in Step S903 a layer 140 of copper may be applied over the surface of the semiconductor wafer 100. In one embodiment, the copper layer 140 is formed by mounting the wafer 100 in the electropolishing apparatus described above (which will subsequently be used to remove the copper), but with the electrical connections reversed, so that the wafer 100 is connected as the cathode. With this arrangement, the copper layer 140 can be applied by electrodeposition in the same apparatus which will be used subsequently to remove the copper from both the surface of the wafer 100 (i.e., the copper layer 140) and the defective copper damascene interconnect structures 104-d, 106-d. As will be understood, without the electrical connection to all of the defective copper damascene interconnect structures 104-d, 106-d, it is possible at least some of the copper in the defective copper damascene interconnect structures 104-d, 106-d would not be removed in the removal step, thereby defeating the purpose of the reworking. Thus, the Step S903 may be used to reestablish the electrical connection over the surface of the wafer 100 to all of the copper damascene interconnect structures, both defective and non-defective.

In another embodiment, the copper layer 140 may be applied in a separate electrodeposition apparatus.

When the copper layer 140 has been applied, the semiconductor wafer 100 with the copper layer 140 may be mounted in the electropolishing apparatus as described above with respect to FIG. 5(a) in Step S902.

With the semiconductor wafer mounted in the electrolytic cell 134 and immersed in the electrolyte 132, electrical current is applied to the wafer to remove from the wafer substantially all copper from the defective copper damascene interconnect structures 104-d, 106-d, as shown in Step S904 of FIG. 9. In an embodiment in which the metal forming the defective damascene interconnect structures 104-d, 106-d is copper or is an alloy of copper, substantially all of the metal is removed. As noted below, in one embodiment, a portion of the barrier layer 118 is also removed by this step. As noted above, the wafer 100 is mounted such that the copper of the defective copper damascene interconnect structures 104-d, 106-d constitute the anode, so that when electrical current is applied, the copper metal is electrolytically removed from the wafer 100. Electrical means 138 that are well known in the art are provided for applying a voltage between the anode formed by the copper of the defective damascene interconnect structures 104-d, 106-d and the cathode 136. The current is preferably direct current or alternating current with a direct current bias. In one embodiment, the current is applied to remove the copper from the defective damascene interconnect structures 104-d, 106-d. In one embodiment, the current is applied until substantially all of the copper has been removed from the semiconductor wafer 100.

When current is applied at various voltages, four regimes may be observed in the current density versus voltage relationship: electrolytic etching, passivating, electropolishing and oxygen evolution. As is known in the art, the following reactions take place in the electrolytic cell:

$$Cu + 2OH^- \rightarrow CuO + H_2O + 2e^-$$

$$CuO + 2H^+ \rightarrow Cu^{++} + H_2O$$

such that the net reaction with respect to copper is:

$$Cu \rightarrow Cu^{++} + 2e^-$$

During copper anodic dissolution, positive copper ions leave the copper film surface of the defective copper damascene interconnect structure and diffuse through the interface into the electrolyte with an equivalent number of electrons remaining in the copper film.

As will be understood by those of skill in the art, interface evolution for the anodic dissolution of crystal surfaces varies from a rough interface at high electrodissolution rates to a layer by layer dissolution mechanism without a significant surface roughening to an electropolishing regime. The initial condition of the metal surface has an influence on the electrodissolution rate. In addition, the electrodissolution rate is also affected and may be controlled by adjustments to the current density (amps per square centimeter of anode or cathode, $A/cm^2$), voltage (V) applied to the anode or cathode, electrolyte composition, electrolyte temperature, hydrodynamic conditions, cathode size, shape and composition.

In one embodiment of the method according to the present invention, a voltage in the range from about 1.7 to about 2.5 volts is applied in an electrolyte containing phosphoric acid and other additives, at a bath temperature in the range from about 17 to about 35° C. In another embodiment, the voltage is applied in the range from about 1.5 to about 3.5 volts. In another embodiment, the bath temperature is in the range from about 10 to about 50° C. In one embodiment, the current density is in the range from about 0.1 $A/cm^2$ to about 10 $A/cm^2$ based on the outer, damascene-containing surface area of the semiconductor wafer. The outer surface of the semiconductor wafer is used for this parameter since the surface area of the defective copper damascene interconnect structure varies during the course of the electrolysis, as the copper is removed.

The electrolyte used for removing the copper from the defective copper damascene interconnect structure may be any of at least three different types, based on the primary acid in the electrolyte. In one embodiment, the electrolyte is based on phosphoric acid, $H_3PO_4$, in one, sulfuric acid, $H_2SO_4$, and in another, on perchloric acid, $HClO_4$. Other acids, such as nitric, sulfonic, benzene sulfonic, and toluene sulfonic, may be used as well as both the primary type and as additives. Exemplary acid mixtures are shown in the following table:

| Primary type of electrolyte | Exemplary electrolyte components |
|---|---|
| phosphoric acid, $H_3PO_4$ | $H_3PO_4$ + $H_2O$ + organic additives |
| | $H_3PO_4$ + $H_2SO_4$ + $H_2O$ + organic additives |
| sulfuric acid, $H_2SO_4$ | $H_2SO_4$ + $H_2O$ + organic additives |
| | $H_2SO_4$ + HCl + $H_2O$ + organic additives |
| perchloric acid, $HClO_4$ | $HClO_4$ + $H_2O$ + organic additives |
| | $HClO_4$ + HCl + $H_2O$ + organic additives |

Appropriate organic additives are known in the art of electrodeposition and electropolishing. The organic additives can be one or more gelatins. The gelatins may include heterogeneous mixtures of water-soluble proteins derived from collagen. Animal glue is an exemplary gelatin. The organic additive may include saccharin, caffeine, molasses, guar gum, gum arabic, thiourea, the polyalkylene glycols (e.g., polyethylene glycol, polypropylene glycol, polyisopropylene glycol, etc.), dithiothreitol, amino acids (e.g., proline, hydroxyproline, cysteine, etc.), acrylamide, sulfopropyl disulfide, tetraethylthiuram disulfide, alkylene oxides (e.g., ethylene oxide, propylene oxide, etc.), the sulfonium alkane sulfonates, thiocarbamoyidisulfide, or derivatives or mixtures of two or more thereof. In one embodiment, the additive comprises an ethanolamine compound, such as monoethanolamine or triethanolamine.

In one embodiment, the organic additive is present in the range from about 0.3 ppm to about 10 ppm, and in one embodiment about 0.5 ppm to about 10 ppm, and in one embodiment, about 1 ppm to about 5 ppm, and in one embodiment from about 2 ppm to about 4 ppm. Other additives may be used as deemed necessary, such as chloride ion. Chloride ion may be present in a concentration in the range from about 0.1 to about 100 ppm. In one embodiment, chloride ion is present from about 5 to about 50 ppm, and in another from about 10 to about 20 ppm.

Figure 6:
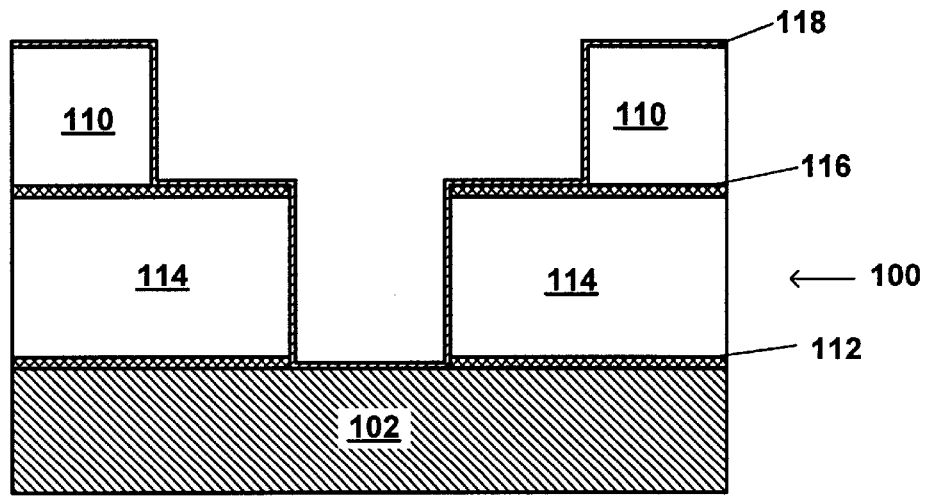
FIG. 6 is a partial cross-sectional view of a cavity for an interconnect following removal of the defective copper damascene interconnect structure.

FIG. 6 is a partial cross-sectional view of a cavity for an interconnect following removal of the defective copper damascene interconnect structure. The step of applying electrical current to the wafer to remove copper from the defective copper damascene interconnect structures 104-d, 106-d is continued in one embodiment until substantially all of the copper has been removed from the wafer 100, as shown in FIG. 6. In one embodiment, the electrical current is applied until all of the copper and at least a portion of the barrier layer 118 has been removed. FIG. 6 shows an embodiment of the wafer 100 following removal of the copper and a small portion of the barrier layer 118. While it is not necessary to remove the barrier layer 118 for the purpose of removing the copper, it may be helpful to allow some removal of the barrier layer in order to assure that all of the copper has been removed.

When the copper has been removed from the defective copper damascene interconnect structures 104-*d*, 106-*d* in Step S904, the semiconductor wafer 100 may be returned to regular production, as shown in Step S-905 of FIG. 9, by re-applying copper to the semiconductor wafer to form a semiconductor wafer 100 having defect-free copper damascene interconnect structures 104, 106 as shown in FIG. 2. In one embodiment, the copper is re-applied by an electrodeposition which is substantially the same as the original electrodeposition, with any necessary adjustments to avoid again forming defects. In one embodiment, the copper is re-applied in the same electrolyte 132 in the same electrolytic bath 134, by simply reversing the polarity of the electrolysis cell, thus making the semiconductor wafer 100 the cathode and the structure 136 the anode, and reapplying copper to re-form the copper damascene interconnect structures 104, 106.

In one embodiment, the copper is re-applied by use of a pulsed-waveform electrodeposition. Such pulsed waveform electrodeposition is described, for example, in U.S. Pat. No. 5,705,230, which disclosure relating to pulsed electrodeposition is hereby incorporated by reference herein. Thus, in the step of re-applying copper, a controlled varying voltage and/or an energy such as low-frequency, high-frequency or ultrasonic vibrations or a light beam may be applied to the substrate. The applicable varying voltage includes voltages of pulsed waveforms such as square wave, trapezoidal wave, triangular wave, sinusoidal wave and random wave. The voltages of such pulsed waveforms may have both positive and negative polarities or they may have only negative polarity. The repetitive voltage components may be zero at periodic times; alternatively, a d.c. component may be added to a periodic wave. The value of the voltage to be applied is preferably such that a maximum absolute value of current density on the surface of the substrate is in the range of from $10^{-3}$ to 1 A/cm$^2$. The low-frequency, high-frequency or ultrasonic vibrations are preferably such that their frequency is in the range of from 45 Hz to 2.5 GHz.

Figure 7:
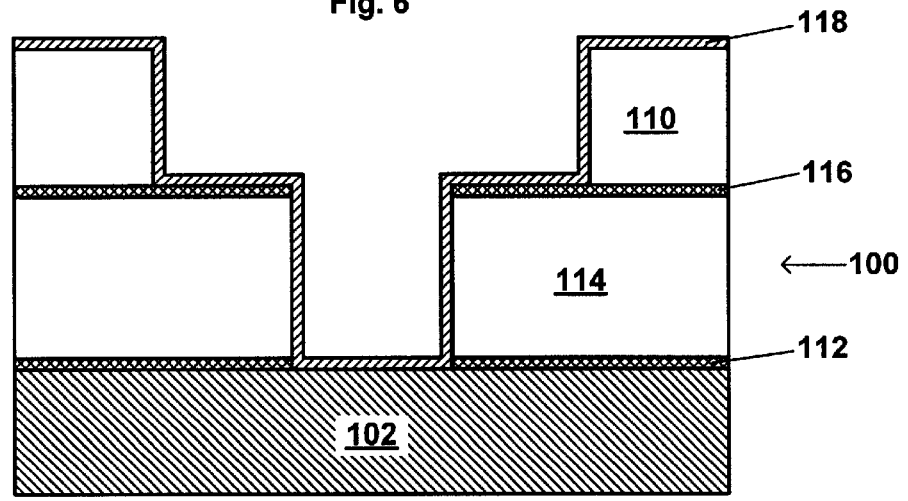
FIG. 7 s a partial cross-sectional view of a cavity for an interconnect following application of the method of the present invention, in which the barrier layer has been re-applied.

In one embodiment, prior to re-applying the copper, a portion of the barrier layer 118 is re-applied, as shown in FIG. 7. FIG. 7 is a partial cross-sectional view of a cavity for an interconnect following application of the method of the present invention, in which the portion of the barrier layer 118 removed in the copper removal step S903 has been re-applied. The barrier layer 118 may be re-applied or replenished by any of the methods used to apply such barrier layer in the first instance, as known in the art and described above.

Figure 8:
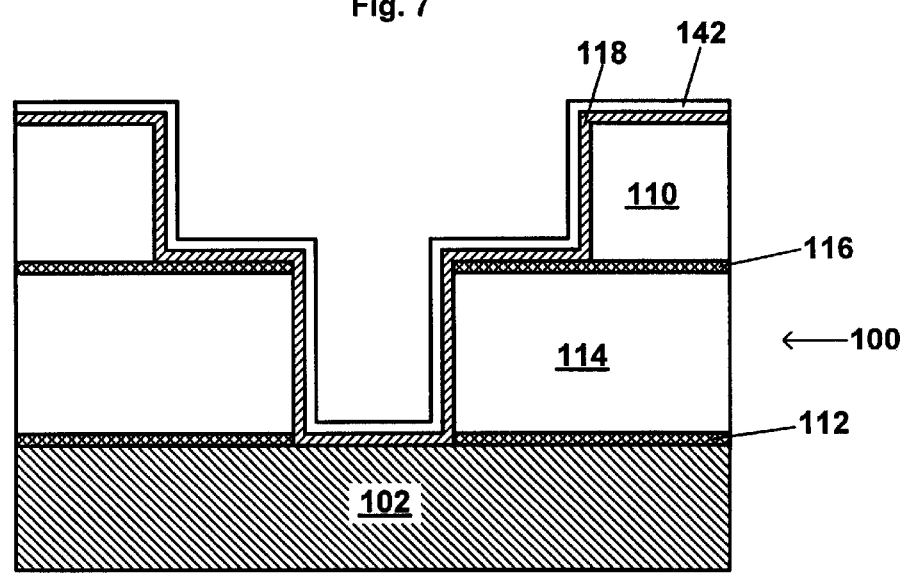
FIG. 8 is a partial cross-sectional view of a cavity for an interconnect following application of the method of the present invention, in which a seed layer has been applied and the wafer is ready for re-application of the copper damascene interconnect, in accordance with the present invention.
Figure 9:
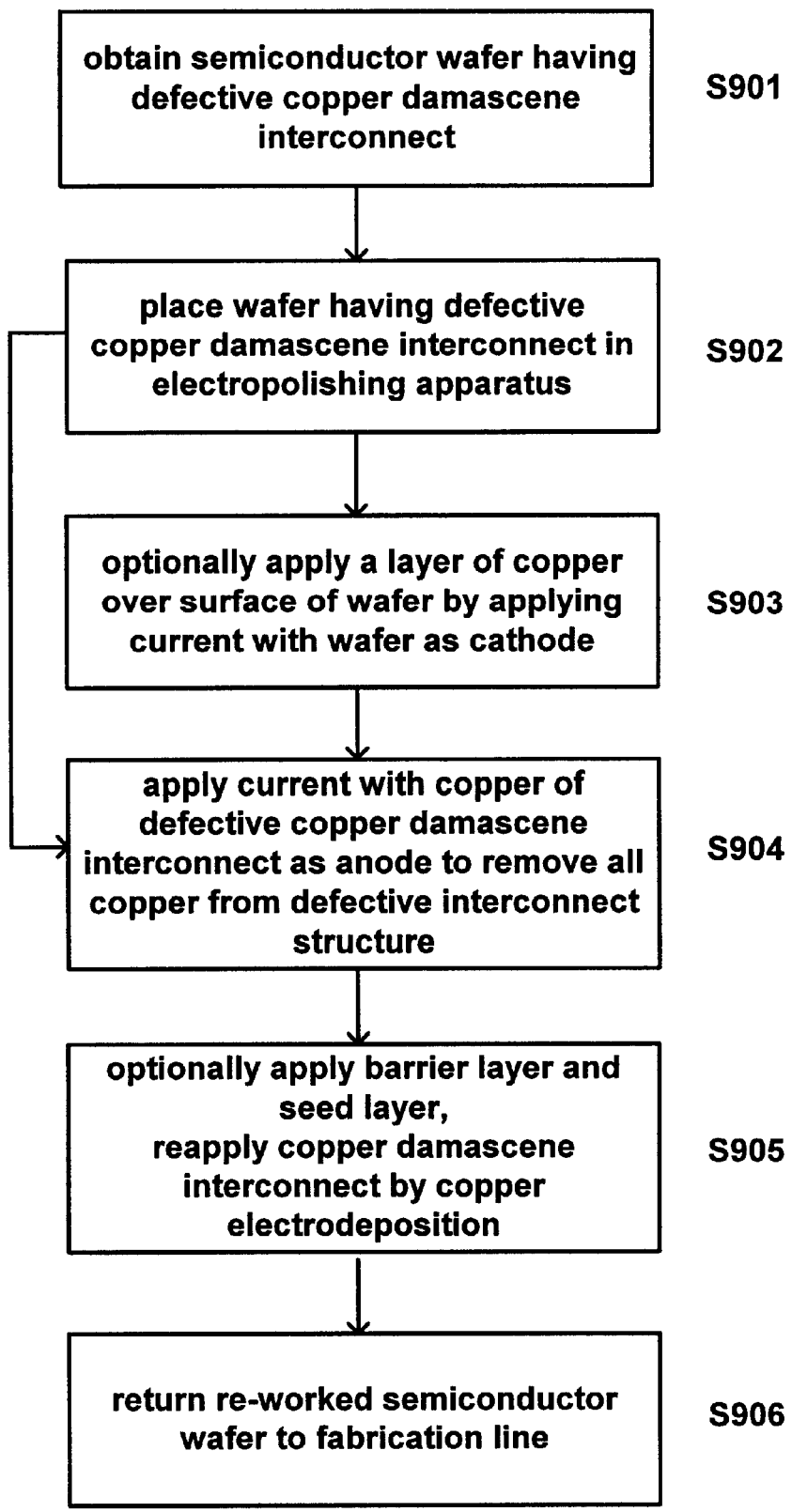
FIG. 9 is a flow diagram of a method of re-working defective copper damascene interconnect structure, in accordance with the present invention.

In one embodiment, a seed layer 142 of copper or other metal is applied over the barrier layer 118 prior to re-applying the copper to re-form the damascene interconnect structures 104, 106, as shown in FIG. 8. FIG. 8 is a partial cross-sectional view of a cavity for an interconnect following application of the method of the present invention, in which a seed layer has been applied and the wafer is ready for re-application of copper to re-form the copper damascene interconnect structures 104, 106. This is an optional treatment, but may help assure that the re-application of the copper of the damascene interconnect structure proceeds without formation of further defects. The seed layer 142 may be a metal such as copper, copper-silver alloy, silver, or another highly conductive metal. In one embodiment, the seed layer is copper. In one embodiment, the seed layer 142 is a copper-silver alloy, and in another embodiment, the seed layer 142 is silver. In one embodiment, the seed layer 142 is a copper alloy, such as 1% Al—Cu, 1% Mg—Cu, 1% Sn—Cu, etc. These copper alloys form a self passivating layer on all of the exposed surfaces of a copper interconnect when provided with appropriate heat treatment. The seed layer 142 may be applied by any of the methods described above for application of the barrier layer 118, may be applied by electrodeposition, or by any method known in the art for application of such seed layer.

Following application of the barrier layer 118 and the seed layer 142, if any, copper is re-applied to re-form the damascene interconnect structures 104, 106 as shown in FIG. 2. Application of the barrier layer 118 and the seed layer 142 may be considered part of Step S-904. In one embodiment, the copper re-applied to form the interconnect structures 104, 106 is a copper alloy such as the 1% Al—Cu, 1% Mg—Cu 1% Sn—Cu, etc. disclosed above for the seed layer 142. In one embodiment, application of the copper may be carried out in the same apparatus as described above for removal of the copper from the defective copper damascene interconnect structure. In one embodiment, the copper is applied by electrodeposition. In one embodiment, the copper is applied by an electroless deposition. In another embodiment, the copper is applied by a CVD process. Such processes are known in the art and need not be described in detail here.

Finally, as shown in Step S-906 of FIG. 9, the re-worked semiconductor wafer 100 may be returned to the fabrication line so that fabrication of the semiconductor devices thereon may be completed. It is noted that although this step is shown in FIG. 9, it is shown for the purpose of placing the present invention in context and is not a required part of or necessary step in the present invention.

What has been described above are certain embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A method of re-working a semiconductor device having a defective copper damascene interconnect structure, comprising:

obtaining a semiconductor wafer having at least one defect in a copper damascene interconnect structure;

placing the wafer in an electrolyte in an electrolytic cell such that the defective copper damascene interconnect structure forms an anode;

applying electrical current to the wafer to remove from the wafer copper from the defective copper damascene interconnect structure; and re-applying copper to the semiconductor wafer to form a copper damascene interconnect structure.

2. The method of claim 1, wherein the defect comprises one or more of a cleft, a sidewall void, a body void and a corner void.

3. The method of claim 1, wherein the electrolytic cell is part of an electropolishing apparatus.

4. The method of claim 1, wherein the electrolyte comprises one or more of phosphate ions, sulfate ions, and perchlorate ions.

5. The method of claim 1, wherein the semiconductor wafer comprises a barrier layer forming a barrier between the copper damascene interconnect structure and the semiconductor wafer.

6. The method of claim 1, further comprising a step of applying a layer of copper on the semiconductor wafer prior to the step of applying electrical current to remove copper.

7. The method of claim 4, wherein the barrier layer is not substantially removed by the step of applying current to remove copper.

8. The method of claim 1, wherein the copper is re-applied by electrodeposition.

9. The method of claim 1, wherein the copper is re-applied by electrodeposition with a pulsed waveform current.

10. The method of claim 1, wherein the step of reapplying copper includes a step of applying a seed layer prior to deposition of copper to form the damascene interconnect structure.

11. The method of claim 1, wherein the step of reapplying copper includes a step of applying a barrier layer prior to deposition of copper to form the damascene interconnect structure.

12. The method of claim 11, wherein the barrier layer is formed by CVD, PVD, HCM, electroless, electroplating, IMP, sputtering, or ALD.

13. A method of re-working a semiconductor device having a defective copper damascene interconnect structure, comprising:

obtaining a semiconductor wafer having at least one defect in a copper damascene interconnect structure, the damascene interconnect structure including a barrier layer forming a barrier between the structure and the semiconductor wafer;

placing the wafer in an acidic electrolyte in an electrolytic cell such that the defective copper damascene interconnect structure is an anode;

applying electrical current to the wafer in the cell to remove from the wafer substantially all copper and at least a portion of the barrier layer from the defective copper damascene interconnect structure;

applying a barrier layer to the semiconductor wafer; and re-applying copper by electrodeposition onto the barrier layer to form a defect-free copper damascene interconnect structure on the semiconductor wafer.

14. The method of claim 13, wherein the defect comprises one or more of a cleft, a sidewall void, a body void or a corner void.

15. The method of claim 13, further comprising a step of applying a layer of copper on the semiconductor wafer prior to the step of applying electrical current to remove copper.

16. The method of claim 13, wherein the barrier layer is formed by CVD, PVD, HCM, electroless, electroplating, IMP, sputtering, or ALD.

17. The method of claim 13, wherein the copper is re-applied by electrodeposition with a pulsed waveform current.

18. The method of claim 13, wherein the step of reapplying copper includes a step of applying a seed layer onto the barrier layer prior to deposition of copper to form the damascene interconnect structure.

19. A method of re-working a semiconductor device having a defective copper damascene interconnect structure, comprising:

obtaining a semiconductor wafer having at least one defect in a copper damascene interconnect structure, the damascene interconnect structure including a barrier layer forming a barrier between the structure and the semiconductor wafer, wherein the defect comprises one or more of a cleft, a sidewall void, a body void or a corner void;

placing the wafer in an acidic electrolyte in an electrolytic cell such that the defective copper damascene interconnect structure is an anode, wherein the electrolyte comprises one or more of phosphate ions, sulfate ions and perchlorate ions;

applying electrical current to the wafer in the cell to remove from the wafer substantially all copper and at least a portion of the barrier layer from the defective copper damascene interconnect structure;

applying a barrier layer to the semiconductor wafer, wherein the barrier layer comprises one or more of Ta, TaN, TaSiN, TiSiN, WN, Co, Ni, Pd, Mo, W, NiW, NiTa, NiMo, CoW, CoTa, CoMo, PdW, PdTa, and PdMo;

applying a seed layer over the barrier layer; and re-applying copper by electrodeposition onto the seed layer to form a defect-free copper damascene interconnect structure on the semiconductor wafer.

20. The method of claim 17, further comprising a step of applying a layer of copper on the semiconductor wafer prior to the step of applying electrical current to remove copper.

* * * * *

UNITED STATES PATENT AND TRADEMARK OFFICE
CERTIFICATE OF CORRECTION

PATENT NO. : 6,495,443 B1
DATED : December 17, 2002
INVENTOR(S) : Lopatin et al.

It is certified that error appears in the above-identified patent and that said Letters Patent is hereby corrected as shown below:

Column 1,
Line 47, replace "modem" with -- modern --

Signed and Sealed this

Twenty-fifth Day of February, 2003

JAMES E. ROGAN
*Director of the United States Patent and Trademark Office*